United States Patent
Simionescu

(10) Patent No.: US 11,420,435 B1
(45) Date of Patent: Aug. 23, 2022

(54) RESTRETCHABLE STENCIL FRAME

(71) Applicant: Petru Aurelian Simionescu, Corpus Christi, TX (US)

(72) Inventor: Petru Aurelian Simionescu, Corpus Christi, TX (US)

(73) Assignee: Texas A&M University Corpus Christi, Corpus Christi, TX (US)

( * ) Notice: Subject to any disclaimer, the term of this patent is extended or adjusted under 35 U.S.C. 154(b) by 0 days.

(21) Appl. No.: 17/408,443

(22) Filed: Aug. 22, 2021

(51) Int. Cl.
*B41F 15/36* (2006.01)
*H05K 3/12* (2006.01)
*B41C 1/14* (2006.01)

(52) U.S. Cl.
CPC .............. *B41F 15/36* (2013.01); *B41C 1/14* (2013.01); *H05K 3/1225* (2013.01)

(58) Field of Classification Search
CPC ........ B41F 15/36; B41C 1/14; H05K 3/1225; B44D 3/185; D06C 3/08; G09F 15/0025
See application file for complete search history.

(56) References Cited

U.S. PATENT DOCUMENTS

| | | | | |
|---|---|---|---|---|
| 1,128,362 A * | 2/1915 | Rawbon | ................ | B44D 3/185 160/374.1 |
| 1,916,022 A * | 6/1933 | Shull | ..................... | B44D 3/185 160/374.1 |
| 3,230,872 A * | 1/1966 | De Groot | ................ | B41F 15/36 101/415.1 |
| 3,625,274 A * | 12/1971 | Johnson | .................. | B44D 3/185 160/374.1 |
| 4,050,498 A * | 9/1977 | Lucchetti | ............... | B44D 3/185 52/657 |
| 5,052,462 A * | 10/1991 | Stobart | .................. | B44D 3/225 160/381 |
| 5,918,392 A * | 7/1999 | Bates | ...................... | B41F 15/36 160/381 |
| 8,936,065 B1 * | 1/2015 | Gillespie | ................ | B44D 3/185 160/374.1 |
| 2018/0072093 A1 * | 3/2018 | Roy | ........................ | B44D 3/18 |

FOREIGN PATENT DOCUMENTS

| | | | | | |
|---|---|---|---|---|---|
| GB | 2364961 A | * | 2/2002 | ............ | B41N 1/248 |
| GB | 2580850 A | * | 7/2020 | ............ | E04B 1/348 |
| WO | WO-9220535 A1 | * | 11/1992 | ............ | B44D 3/185 |
| WO | WO-2011023964 A1 | * | 3/2011 | ............ | B41F 15/36 |

* cited by examiner

*Primary Examiner* — Matthew G Marini
*Assistant Examiner* — Marissa Ferguson-Samreth

(57) ABSTRACT

The restretchable stencil frame according to the present invention consists of a metallic stencil foil mounted on a rectangular frame fabricated of tubular material or C-channel. Each corner of the frame is provided with one screw-actuated conical expander and one counterplate serving to biaxially tension the stencil foil. To ensure uniform stretching of the stencil foil, areas of increased elasticity are provided to the corners of the frame and to the foil itself in the form of oriented slots, cuts, holes and combination thereof.

4 Claims, 4 Drawing Sheets

RESTRETCHABLE STENCIL FRAME

BACKGROUND—PRIOR ART

Figure 1:
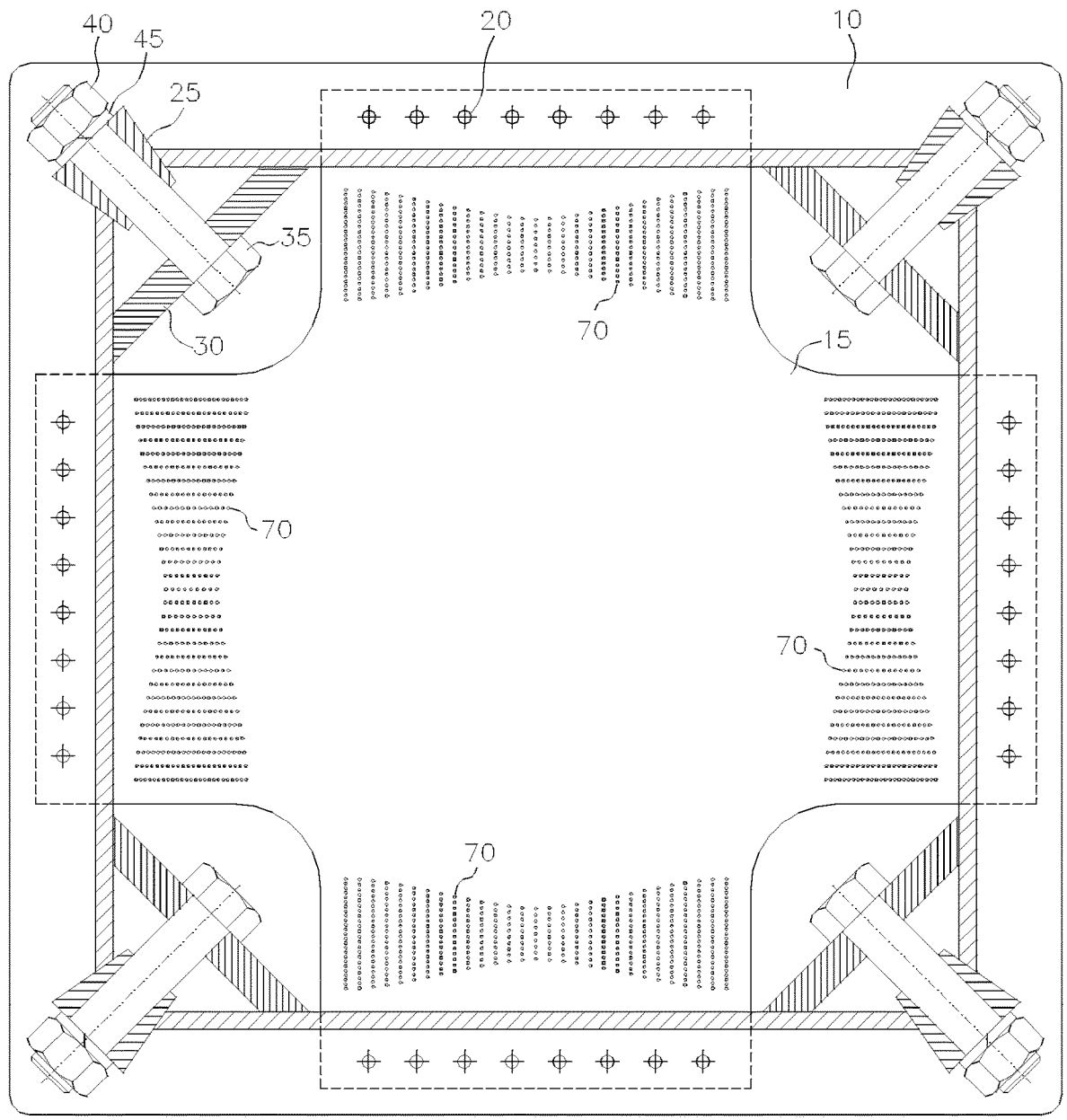

The following is a tabulation of some prior art that presently appears relevant

| Number | Date | Inventor(s) |
| --- | --- | --- |
| U.S. Pat. No. 424095 | Mar. 25, 1890 | Cope |
| U.S. Pat. No. 424096 | Mar. 25, 1890 | Cope |
| U.S. Pat. No. 367672 | Aug. 02, 1887 | Shattuck |
| U.S. Pat. No. 1847925 | Mar. 1, 1932 | Carter |
| U.S. Pat. No. 1916022 | Jun, 27, 1933 | Shull |
| U.S. Pat. No. 3230872 | Jan. 25, 1966 | Groot |
| U.S. Pat. No. 3625274 | Dec. 7, 1971 | Johnson |
| U.S. Pat. No. 3914887 | Oct. 28, 1975 | Newman |
| U.S. Pat. No. 4452138 | Jun. 5, 1984 | Bubley & Green |
| U.S. Pat. No. 4846079 | Jul. 11, 1989 | Ajax |
| U.S. Pat. No. 5076162 | Dec. 31, 1991 | Goin |
| U.S. Pat. No. 5271171 | Dec. 21, 1993 | Smith |
| U.S. Pat. No. 5839214 | Nov. 24, 1998 | Peterson |
| U.S. Pat. No. 6360659 | Mar. 26, 2002 | Newman |
| U.S. Pat. No. 6427588 | Aug. 6, 2002 | Kline |
| US20040101358 | May 27, 2004 | Odorico |
| U.S. Pat. No. 7735541 | Jun. 15, 2010 | Ocampo |
| U.S. Pat. No. 8936065 | Jan. 20, 2015 | Gillespie |
| GB2551120 | Dec. 13, 2017 | Gill |

1. TECHNICAL FIELD

The present invention relates to a frame for adjustably tensioning a sheet material, in particular a stencil foil used for, but not limited to, printing solder paste onto a circuit board, said frame being additionally reusable.

2. BACKGROUND ART

Stencil frames, also known as print-screen frames or screen chases have been developed in a variety of configurations and have been used in many industries and crafts such as textile industry, canvas painting, printed circuit board industry, etc.

Two types of stencil-frame designs are presently in use: stencil frames which do not allow the stencil foil to be re-taut and restore tension, and stencil frames where the stencil foil can be re-taut when it loses tension, or to replaced it with a different foil when its print becomes obsolete, or the foil becomes damaged. In case of the latter type of stencil frames, the foil can be stretched either by mechanical means, or through the effect of a pressurized fluid, in particular compressed air. Both types must ensure that the stencil foil attaches inexpensively and reliably to the frame, that the foil is stretched uniformly, and that some degree of compliance is provided to the assembly when the stencil foil is made of sheet metal, and therefore it is substantially stiffer in tension than the frame is stiff in bending.

3. OBJECTS AND SUMMARY OF THE PRESENT INVENTION

It is the object of the present invention to provide a restretchable stencil frame which is characterized by simple construction.

It is another object of the present invention to provide a restretchable stencil frame, the frame of which can be reused if the stencil print becomes obsolete.

Yet it is another object of the present invention to provide a restretchable stencil frame where the tension induced in the stencil foil is uniform.

These and other objects are obtained in accordance with the present invention wherein there is provided a stencil foil mounted on a rectangular frame fabricated of tubular material or C-channel, the corners of said frame being split along the diagonal of the frame through the respective corner, and being provided additionally with screw-actuated conical expanders. The said diagonal splits can be either incomplete and practiced on both sides, or fully split on the screen side only. When the screws of the conical expanders are tightened, the frame members are forced outwardly, thus inducing a biaxial tension to the stencil foil. To ensure uniform stretch of the stencil foil, areas of increased elasticity are provided to the foil in the form of rows of holes, or of parallel slots of variable lengths, arranged perpendicular to the edges of the foil.

4. BRIEF DESCRIPTION OF THE DRAWINGS

Further objects of the present invention will become apparent from the following description with reference to the accompanying drawings in which:

FIG. 1 is a cross-sectional top view of the restretchable stencil frame of the present invention made of C-channel, which employs one cone-frustum expander per corner, said expanders acting from the outside and operating each in conjunction with one machine screw and one wedge-like counterplate. FIG. 1 also shows a means of uniformizing the stretch of the stencil foil by the use of a plurality of holes arranged in parallel rows of different lengths.

Figure 2:
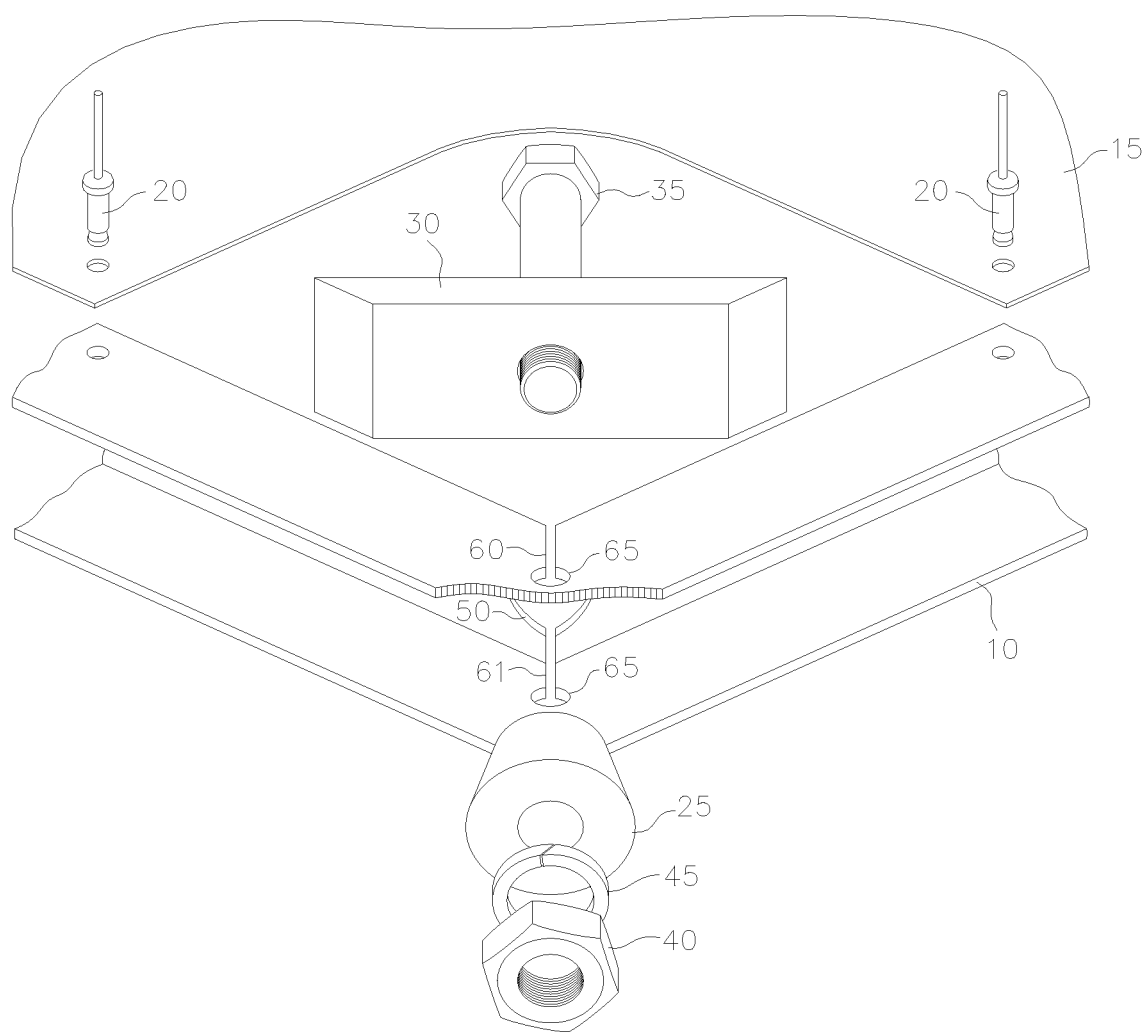

FIG. 2 is a detailed, exploded view of one corner expander as shown in FIG. 1, also disclosing a means of increasing the compliance of the frame by means of two partial cuts per each corner of the frame.

Figure 3:
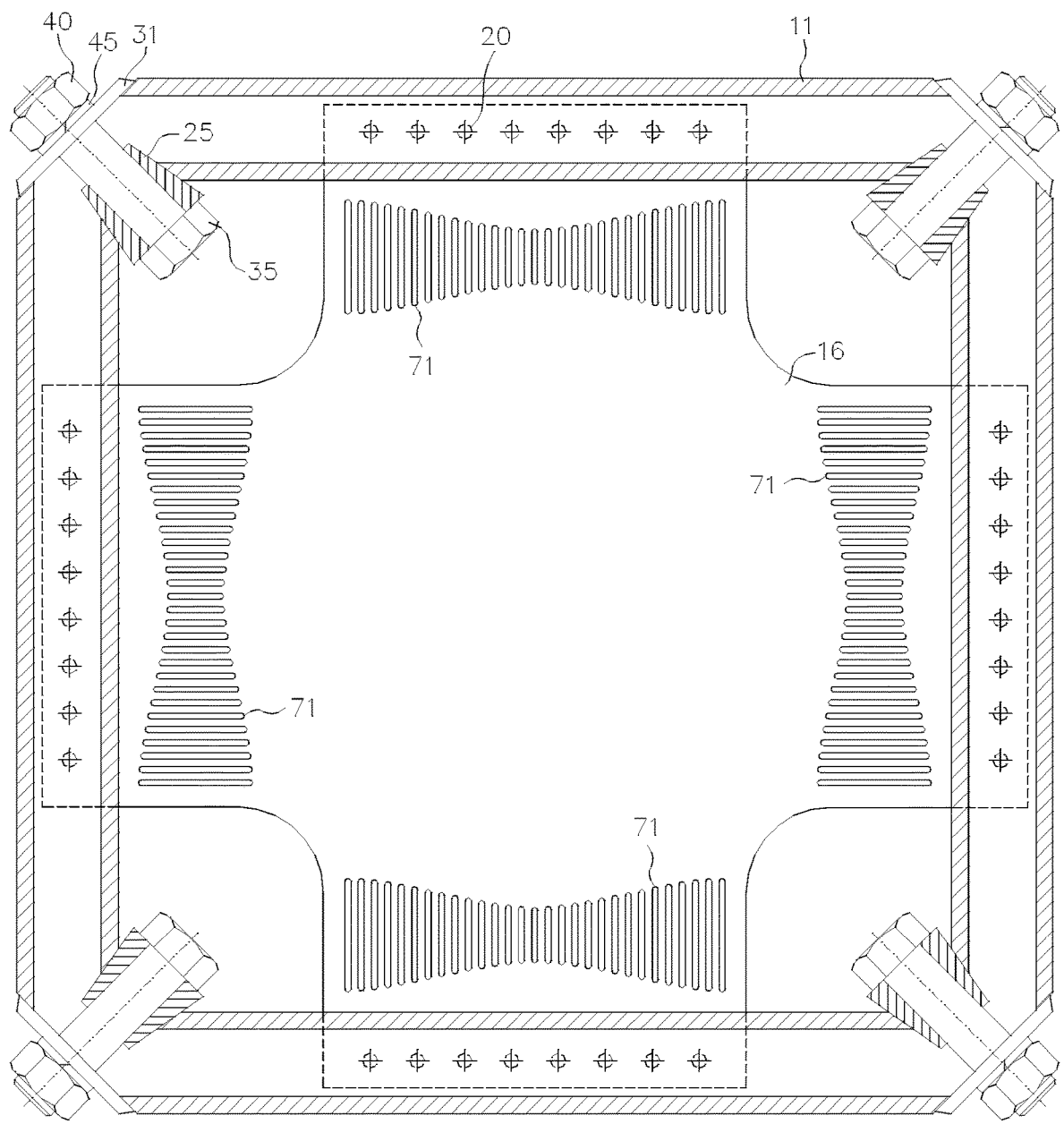

FIG. 3 is a cross-sectional top view of another embodiment of the restretchable stencil frame of the present invention made of tubular material, which employs one cone-frustum expander per corner acting from the inside, said expanders operating each in conjunction with one machine screw and one flat counterplate. FIG. 3 also shows another means of uniformizing the stretch of the stencil foil by the use of parallel slots of different lengths.

Figure 4:
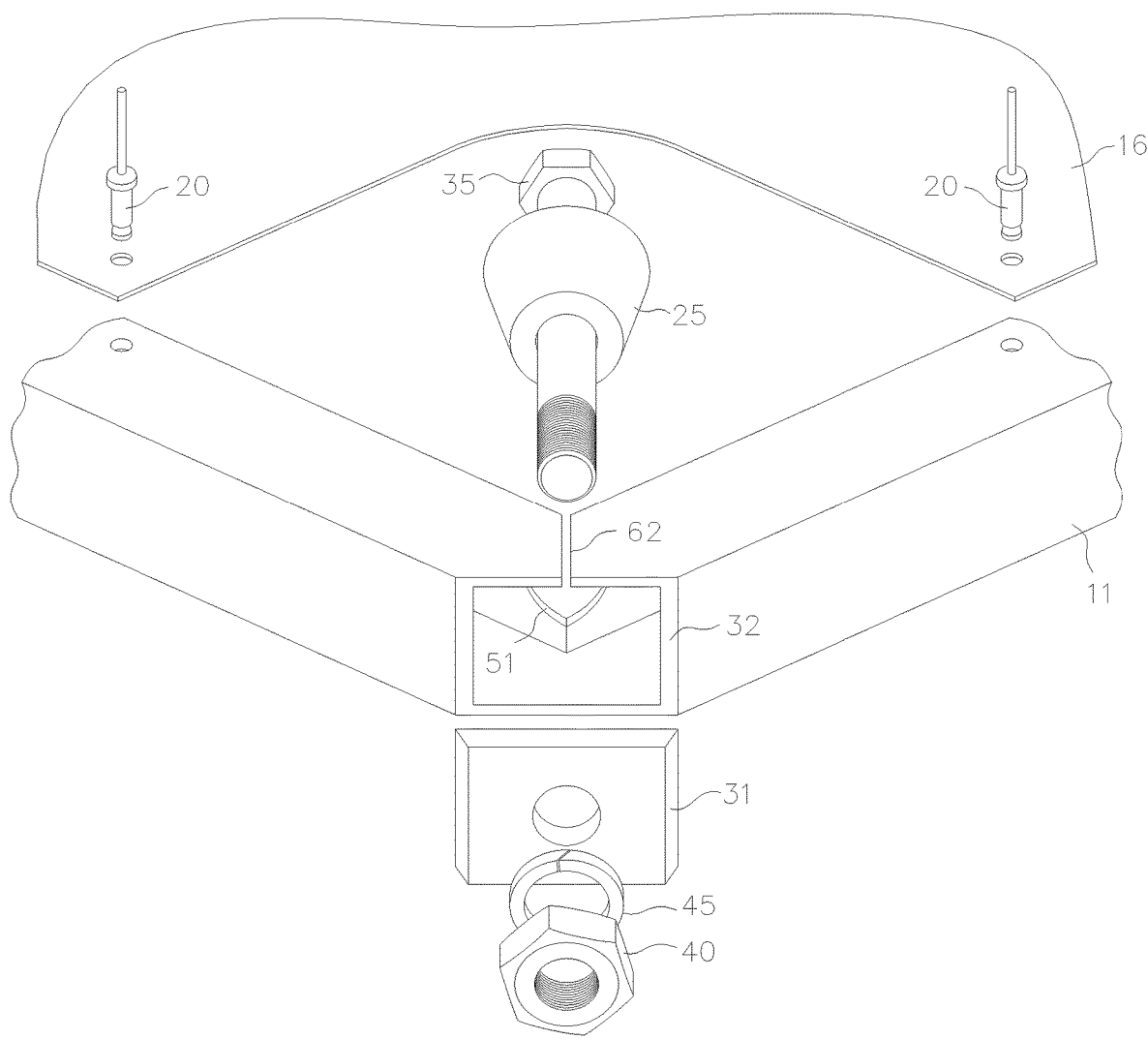

FIG. 4 is a detailed, exploded view of one corner expander as shown in FIG. 3, also disclosing another means of increasing the compliance of the frame by means of sided per each corner of the frame.

5. DESCRIPTION OF THE PREFERRED EMBODIMENTS

FIG. 1 and FIG. 2 show a restretchable stencil frame according to the present invention consisting of a rectangular frame 10 made of a C-channel material, in particular of an aluminum alloy. A stencil foil 15 shaped like a Swiss cross with rounded interior corners assembles with frame 10 using a plurality of screws, pins, rivets (in particular pop rivets) or combination thereof 20. At each corner of the frame, a cone-frustum expander 25 assembles with a wedge-like counterplate 30 by means of a machine screw 35, a nut 40 and a lock washer 45. When screw 35 and nut 40 are tightened together, cone-frustum expander 25 is urged inside of a hole 50 practiced diagonally through the corner of frame 10. Together, the wedge-like counterplate 30 and cone-frustum expander 25 impart an outward expansion of the frame, resulting in a biaxial tensioning of stencil foil 15. To increase the compliance of the corners of frame 10 and to facilitate a more uniform stretching of stencil foil 15, partial cuts 60 and 61 are provided, ending each with a hole 65 meant to alleviate the stress-concentrator effect of said partial cuts. To further ensure that the stretching of foil 15 is uniform when forced outwards by the more flexible frame 10, a plurality of holes 70 are provided. Said holes are practiced close to where foil 15 assembles with frame 10, are arranged symmetrically in rows of different lengths, such that the stencil foil is less rigid in tension close to the corners of the stencil frame. The size and disposition of holes 70 for which stencil foil 15 is stretched uniformly can be determined experimentally by trial and error, or by using a Finite Element Analysis computer software.

FIG. 3 and FIG. 4 show a second embodiment of the restretchable stencil frame according to the present invention, where a rectangular frame 11 made of tubular material with square or rectangular cross-section is employed. A stencil foil 16 assembles with frame 11 using a plurality of screws, pins or rivets 20, and receives its tensioning from the simultaneous outward action of cone-frustum expanders 25. Expanders 25 work each in conjunction with a flat counterplate 31, a machine screw 35, a nut 40 and a lock washer 45. Counterplates 31 rest each on a surface 32 machined perpendicular to the diagonal of frame 11. To increase the compliance of frame 11 near its corners, and to facilitate a more uniform stretching of stencil foil 16, one sided cut 62 is provided on the stencil-foil side of each corner of the frame. To further ensure that stencil foil 16 is stretched uniformly when forced outwards by the more flexible frame 11, a plurality of parallel slots 71 are provided. Said parallel slots are practiced close to where foil 16 assembles with frame 11, are arranged symmetrically and have different lengths, such that stencil foil 16 is less rigid in tension close to the corners of the stencil frame. The size and disposition of slots 71 for which stencil foil 16 is stretched uniformly can be determined experimentally or by using a Finite Element Analysis computer software.

While several embodiments of the invention have been particularly described in the specification and illustrated in the accompanying drawings, it should be understood that the invention is not so limited. Many modifications, equivalents and adaptations of the invention will become apparent with those skilled in the art without departing from the spirit and scope of the invention as defined in the following claims:

What we claim is:

1. Restretchable stencil frame comprising of a stencil foil mounted on a congruent, continuous rectangular frame made of one piece that is restretchable by the use of one cone-frustum expander per each corner of the frame, which fits one hole drilled diagonally through the middle of said corner, and operates in conjunction with one counterplate and one machine screw with nut, in such a way that by tightening the said nut, an outwardly displacement of the sides of the frame is induced, causing the stencil foil to stretch.

2. Restretchable stencil frame according to claim 1, where each corner of the frame has increased compliance ensured by the use of, incomplete, straight cuts aligned with the diagonal plane of the frame through the respective corner.

3. Restretchable stencil frame according to claim 1, where the stencil foil has controlled stiffness ensured by a plurality of holes practiced through the stencil foil that are arranged in parallel rows of different lengths, disposed close to the edges of said foil and oriented perpendicular to the respective edges.

4. Restretchable stencil frame according to claim 1, where the stencil foil has controlled axial stiffness ensured by a plurality of parallel slots of different lengths, disposed close to the edges of said foil and oriented perpendicular to the respective edges.

* * * * *